United States Patent [19]

Kubota

[11] Patent Number: 5,383,159
[45] Date of Patent: Jan. 17, 1995

[54] SEMICONDUCTOR MEMORY DEVICE OF ALTERNATELY-ACTIVATED OPEN BIT-LINE ARCHITECTURE

[75] Inventor: Yasushi Kubota, Sakurai, Japan
[73] Assignee: Sharp Kabushiki Kaisha, Osaka, Japan
[21] Appl. No.: 120,823
[22] Filed: Sep. 15, 1993
[30] Foreign Application Priority Data
  Sep. 17, 1992 [JP] Japan .................. 4-247666
[51] Int. Cl.6 ............................................ G11C 7/00
[52] U.S. Cl. .................................. 365/207; 365/210; 365/230.01
[58] Field of Search ............... 365/207, 210, 230.01, 365/149

[56] References Cited

U.S. PATENT DOCUMENTS

| | | | |
|---|---|---|---|
| 4,903,344 | 2/1990 | Inoue | 365/207 |
| 4,943,949 | 7/1990 | Yamaguchi et al. | 365/149 |
| 5,134,588 | 7/1992 | Kubota et al. | 365/207 |

OTHER PUBLICATIONS

1) Tsutomu Yoshihara, Hideto Hidaka, Yoshio Matsuda and Kazuyasu Fujishima "A Twisted Bit Line Technique for Multi-Mb DRAMS", 1988 IEEE International Solid-State Circuit Conference, pp. 238-239.
2) Yasushi Kubota, Katsuji Iguchi, Keiichiro Uda and Junkou Takagi: "Alternately-Activated Open Bit-Line Architecture for High Density DRAMS", 1991 the Institute of Electronics, Information and Communication Engineers Spring National Convention Records C-660, pp. 5-251.

Primary Examiner—Eugene R. LaRoche
Assistant Examiner—F. Niranjan
Attorney, Agent, or Firm—Nixon & Vanderhye

[57] ABSTRACT

A semiconductor memory device of alternately-activated open bit-line architecture is provided wherein paired bit lines extend from opposite sides of sense amplifiers that are arranged in one direction and every other bit line is activated through activation of a word line intersecting the bit lines. The sense amplifiers in the neighboring first and second rows alternate with each other in a staggering manner. The bit lines extending from the sense amplifiers of the first row in a first direction and the bit lines extending from the sense amplifiers in the opposite, second direction constitute a bit line group between the first and second rows. Word lines and dummy word lines intersect the bit line group. In operation, signals opposite in phase to each other are applied to a selected word line and a corresponding dummy word line from a control section so that memory cells connected to the selected word line are electrically connected with the bit lines while the dummy cells connected with the same bit lines are electrically disconnected from these bit lines.

7 Claims, 5 Drawing Sheets

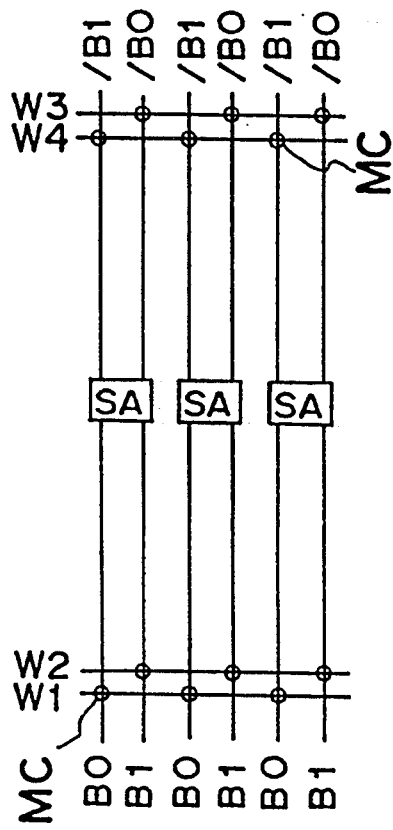
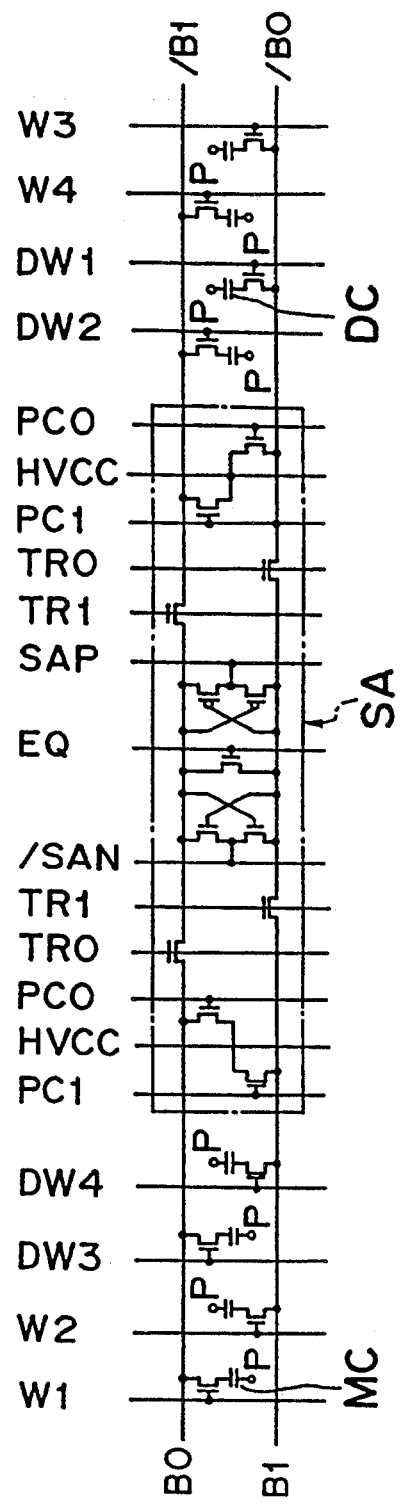
Fig. 1A PRIOR ART
Fig. 1B PRIOR ART

SEMICONDUCTOR MEMORY DEVICE OF ALTERNATELY-ACTIVATED OPEN BIT-LINE ARCHITECTURE

BACKGROUND OF THE INVENTION

The present invention relates to a semiconductor memory device, such as a dynamic random access memory (DRAM), of alternately-activated open-bit line architecture, and more particularly to a method of driving dummy word lines for cancellation of noises to be generated when word lines and bit lines are activated.

FIG. 1A shows a prior art DRAM of alternately-activated open bit-line architecture as disclosed in 1991 the Institute of Electronics, Information and Communication Engineers Spring National Convention Records C-660. FIG. 1B is an enlarged detail of the DRAM shown in FIG. 1A. Referring to FIG. 1A, the DRAM has differential sense amplifiers SA (only three of which are shown) arranged in a row, and pairs of bit lines connected to the sense amplifiers SA. Two pairs of bit lines B0 and /B0, B1 and /B1 extend outwardly from opposite sides of each sense amplifier SA. Memory cells MC are disposed at intersections between the alternate bit lines B0, B1, /B0, /B1 and word lines W1, W2, W3, W4. In reading operation, when the word line W1, for example, is activated, the alternate bit lines B0 are activated by a signal (storage charge) in the memory cells MC connected to the word line W1. At this time, electric potentials on the bit lines B1 are fixed, and therefore interference noise between neighboring bit lines is greatly reduced.

Referring to FIG. 1B, there are also shown dummy cells DC and dummy word lines DW1, . . . , DW4. Such components are often employed not only in a DRAM of open bit-line architecture but also in a common DRAM. The dummy cells DC and the dummy word lines DW1, . . . , DW4 have utterly the same constructions as those of the memory cells MC and the word lines W1, . . . , W4 respectively, inclusive of parasitic capacitance. When a signal is read out on the bit lines B0, for example, from the corresponding memory cells MC, various noises similar to those generated on the bit line B0 are made to be generated on the counterpart bit line /B0 as well. Various noises occurring during the data reading operation are thereby canceled and the intensity of the signal is increased.

In the above example, the sense amplifiers SA are arranged in a row at a pitch equivalent to twice the bit line pitch. However, when the integration scale exceeds the level of a 64 Mbit DRAM (wherein the bit line pitch is about 1.0 μm), it is difficult to arrange the sense amplifiers SA in a width corresponding to twice the bit line pitch. This is because channel lengths of transistors constituting each sense amplifier SA and the size of diffusion regions cannot be reduced in conformity to a scaling rule since the sensitivity of each sense amplifier SA is required to be maintained at a certain high level. In more detail, when the channel lengths of the transistors constituting each sense amplifier SA are reduced, a difference takes place between the paired transistors in effective channel length and/or threshold voltage due to a scatter in fabrication process of the transistors. On the other hand, when the diffusion regions are dimensionally reduced, a difference takes place between the load capacitances of the sense amplifiers SA. Those differences are major factors of the reduction of the sensitivity of each sense amplifier SA.

For the above reasons, the prior art arrangement cannot be used for high density DRAMs.

In order to solve this problem, the present inventor has designed an improved DRAM of alternately-activated open bit-line architecture. The arrangement of the DRAM is shown in FIG. 2. In the DRAM shown in FIG. 2, differential type sense amplifiers SA are arranged in a staggering manner. Two bit lines extend from either side of each sense amplifier, and a plurality of word lines (only two of which are shown by WL1 and WL2) and two dummy word lines (DWL1 and DWL2) intersect the bit lines positioned between the rows of the sense amplifiers. Memory cells MC are provided at intersections between the bit lines and the word lines WL1, WL2 and dummy memory cells DC are provided at intersections between the bit lines and the dummy word lines DWL1, DWL 2 so that cell array blocks (four ow which are shown by MB0, MB1, MB2, MB3) are provided between the rows of the sense amplifiers SA. According to this arrangement, the sense amplifiers SA in each row can be arranged at a pitch equivalent to at least four times the bit line pitch. Accordingly, even though the bit line pitch is reduced, a relatively large area can be assured for each sense amplifier SA (more specifically, for the channel length and/or diffusion area of each transistor). As a result, it is possible to increase the packing density while keeping high the sensitivity of each sense amplifier.

However, the inventor has found that this improved DRAM has the following drawbacks.

For example, when a word line WL1 connected to the cell array block MB2 is activated to select memory cells MC provided at the intersections between the word line WL1 and the bit lines BL0, BL2, BL4, BL6, for example, two dummy word lines DWL2 connected to the neighboring cell array blocks MB1 and MB3 respectively must be activated at the same time. This is because bit lines /BL0, /BL2, /BL4, /BL6 being counterparts of the bit lines BL0, BL2, BL4, BL6 are arranged alternately in the neighboring memory cell blocks MB1 and MB3. Thus, this arrangement requires a complicated operation and circuit design for driving the dummy word lines. Furthermore, one dummy word line located in a certain cell array block can be a counterpart of the word lines located in different two cell array blocks on both sides of the certain cell array block. For instance, the dummy word line DWL1 provided in the cell array block MB2 is activated when memory cells MC in either of the neighboring cell array blocks MB1 and MB3 are selected. This also complicates the operation and circuit design for driving the dummy word lines. FIG. 3 shows waveforms of drive signals for the word lines WL (WL1, WL2) and the dummy word lines DWL (DWL1, DWL2). As shown in FIG. 3, both the word lines and the dummy word lines assume a potential of ground GND when not selected and an elevated potential VBST higher than a potential of a power supply when selected.

SUMMARY OF THE INVENTION

The object of the present invention is therefore to provide a semiconductor memory device of alternately-activated open bit-line architecture which can respond to the need for increase of a packing density or integration scale to a level of 64 Mbits or more without decreasing sensitivity of the sense amplifiers, and which can simplify the dummy word line driving operation.

In order to achieve the above object, the present invention provides a semiconductor memory device, comprising:

- a plurality of sense amplifiers of differential type arranged in one direction in rows, wherein the neighboring rows constitute associated first and second rows and the sense amplifiers of the first and second rows are disposed alternately with each other in a staggering manner;
- two pairs of bit lines extending from each of the sense amplifiers of the first and second rows in opposite first and second directions, wherein the bit lines extending from the sense amplifiers of the first row in the first direction and the bit lines extending from the sense amplifiers of the second row in the second direction constitute a bit line group between the first and second rows;
- a plurality of word lines intersecting said bit line group;
- a pair of dummy word lines intersecting said bit line group;
- a plurality of memory cells disposed at intersections between the bit lines in said bit line group and said word lines such that the memory cells connected with one word line are connected with alternate bit lines and that the memory cells connected with one bit line are connected with alternate word lines;
- a plurality of dummy cells disposed at intersections between the bit lines in said group and said dummy word lines such that the dummy cells connected with one dummy word line are connected with the alternate bit lines and that the dummy cells connected with the other dummy word line are connected with the remaining bit lines;
- a control section for controlling activation of a selected one of said word lines by a signal, said control section applying to a corresponding dummy word line a signal opposite in phase from that applied to said selected word line such that when the memory cells connected with the activated word line are electrically connected with the associated bit lines, the dummy cells connected with the same bit lines are electrically disconnected therefrom.

In the semiconductor memory device of the present invention, the sense amplifiers in each row are arranged at a pitch equivalent to at least four times the bit line pitch. Therefore, an area occupied by one sense amplifier (the channel length and/or diffusion region of each transistor) can be made relatively large even when the bit line pitch is reduced. As a result, a high packing density is attained without decreasing the sensitivity of each sense amplifier.

The memory cells and dummy cells connected with the bit lines in the bit line group constitute a cell array block.

According to the present invention, unlike the DRAM of FIG. 2 wherein when a word line provided in a certain cell array block is activated, two dummy word lines provided in the neighboring cell array blocks are required to be activated for cancellation of noises, only one dummy word line, which is provided in the same cell array block as the selected word line, is operated so as to be electrically disconnected from the bit lines. As a result, selection of the address of the dummy word line to be inactivated can be effected easily. This very much contributes to simplification of a circuit design and operation for driving the dummy word lines.

Noise cancellation is performed as follows. That is, when a selected word line is activated by the signal of a high level applied from the control section, the memory cells connected to the selected word line are electrically connected with the bit lines which are thus activated. At this time, the dummy cells connected to the same bit lines are electrically disconnected from these bit lines by the signal opposite in phase to that applied to the word line. As a result, the capacitance of each bit line is kept unchanged. Noise due to parasitic capacitances between the word line and the bit lines are also canceled by a noise from the dummy word line having a characteristic opposite to the noise from the word line.

Preferably, the control section controls a potential of each dummy word line to a first high level of a power supply when the dummy word line is not selected and to a level of ground when the dummy word line is selected; while controlling a potential of each word line to the first high level during a time of data reading, to a second high level higher than the first high level during a time of data writing, and to the level of ground when the word line is not selected.

In this case, potentials opposite in sign and same in magnitude are applied to the selected word line and dummy word line in the time of data reading to substantially completely cancel the noise. In the time of data writing, the word line is driven to the further elevated potential to assure a satisfying data writing operation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A shows a prior art DRAM of alternately-activated open bit-line architecture;

FIG. 1B shows an enlarged detail of the DRAM shown in FIG. 1A;

DETAILED DESCRIPTION OF THE PREFERRED EMBODIMENTS

Figure 4:
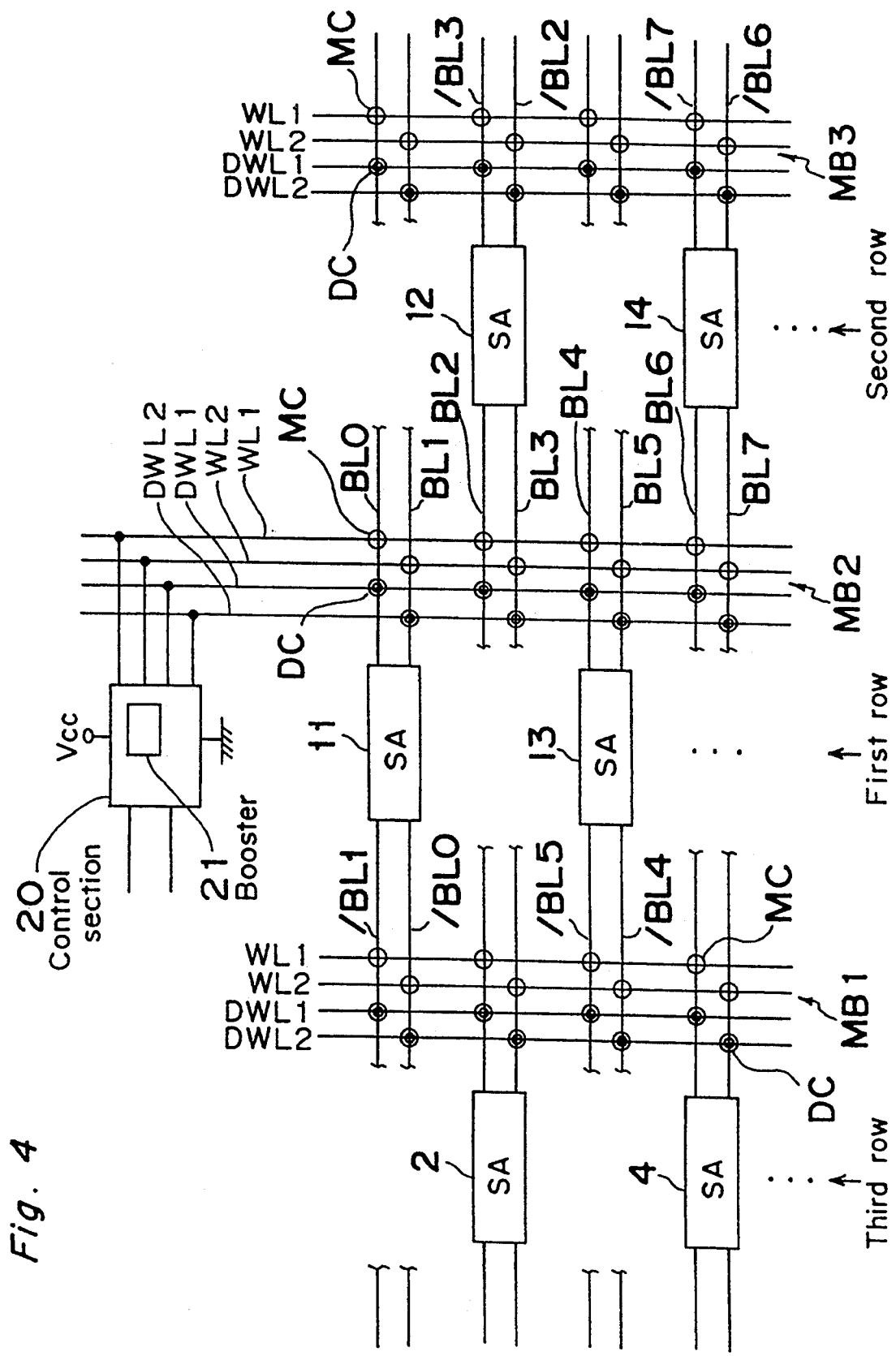
FIG. 4 shows a DRAM of alternately-activated open bit-line architecture in accordance with an embodiment of the present invention.

FIG. 4 shows an arrangement of a DRAM of alternately-activated open bit-line architecture in accordance with an embodiment of the present invention. The DRAM has a plurality of rows of sense amplifiers of differential type, only three of which rows are shown in FIG. 4. The rows are substantially parallel to each other. As shown in FIG. 4, the sense amplifiers (only two of which are shown by 11 and 13) in a first row are spaced substantially the same distance from each other.

Similarly, the sense amplifiers (only two of which are shown by 12 and 14) in a second row placed on one side of the first row are spaced substantially the same distance from each other, and the sense amplifiers (only two of which are shown by 2 and 4) in a third row placed on the other side of the first row are spaced substantially the same distance from each other. The sense amplifiers 11, 13 in the first row alternate with the sense amplifiers 12 and 14 in the second row, so that they are arranged in a staggering manner. Similarly, the sense amplifiers 2, 4 in the third row alternate with the sense amplifiers 11 and 13 in the first row, so that they are arranged in a staggering manner. This is true with the other rows not shown. Each adjacent two rows, namely the first and second rows and the first and third rows in FIG. 4, are associated with each other.

Two bit lines extend outwardly from each sense amplifier in the opposite first and second directions (to the right and left in the figure). For example, bit lines BL0 and BL1 and bit lines /BL1 and /BL0 extend from the sense amplifier 11 of the first row in the opposite directions. Bit lines BL4 and BL5 and bit lines /BL5 and /BL4 extend from the sense amplifier 13 of the first row in the opposite directions. Bit lines /BL3 and/BL2 and BL2 and BL3 extend from the sense amplifier 12 of the second row in the opposite directions, so that bit lines BL2 and BL3 are disposed between the bit lines BL1 and BL4. Similarly, bit lines /BL7 and /BL6 and bit lines BL6 and BL7 extend from the sense amplifier 14 of the second row, so that the bit lines BL6 and BL7 are disposed next to the bit line BL5. Each sense amplifier amplifies the difference in potential between each paired bit lines extending in the opposite directions therefrom.

The bit lines BL0 and BL1, BL2 and BL3, BL4 and BL5, and BL6 and BL7 disposed between the first and second rows of the sense amplifiers constitute a bit line group. Similarly, the bit lines disposed between the third and first rows of the sense amplifiers constitute a bit line group. In this way, a plurality of bit line groups are provided between the neighboring rows of the sense amplifiers.

A plurality of word lines (only two of which are shown by WL1 and WL2) and two dummy word lines DWL1 and DWL2 intersect the bit lines of the bit line group between each adjacent two rows of the sense amplifiers, and memory cells MC and dummy cells DC are provided at the intersections between those bit lines and the word lines WL1, WL2 and dummy word lines DWL1, DWL2. The memory cells MC and dummy cells DC provided between each two adjacent rows of the sense amplifiers (e.g., the first and second rows, the third and first rows) constitute a cell array block MB (MB1, MB2, MB3).

Figure 2:
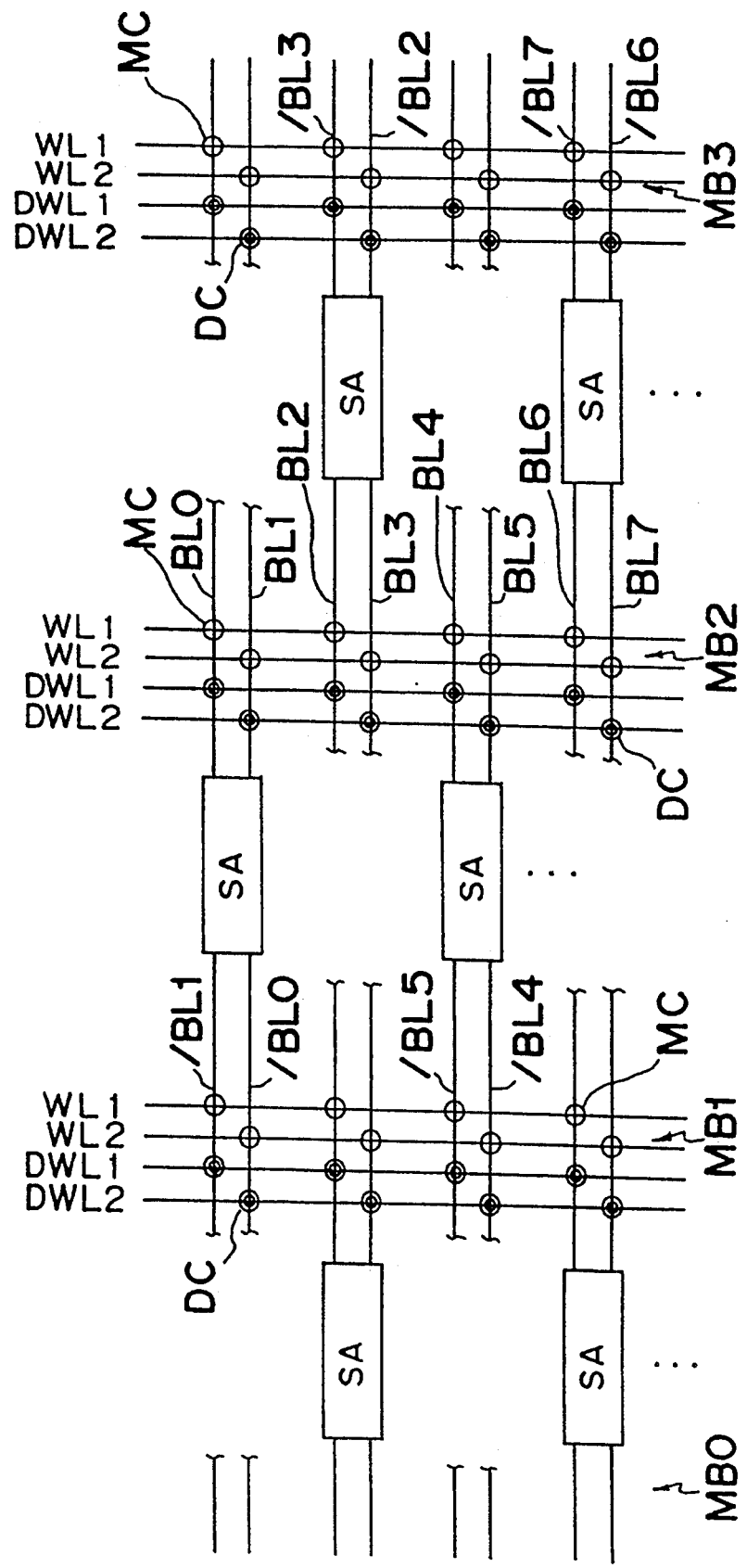
FIG. 2 shows a solution to the problems caused by the prior art DRAM, wherein the arrangement of sense amplifiers is different from that of the prior art DRAM.
Figure 3:
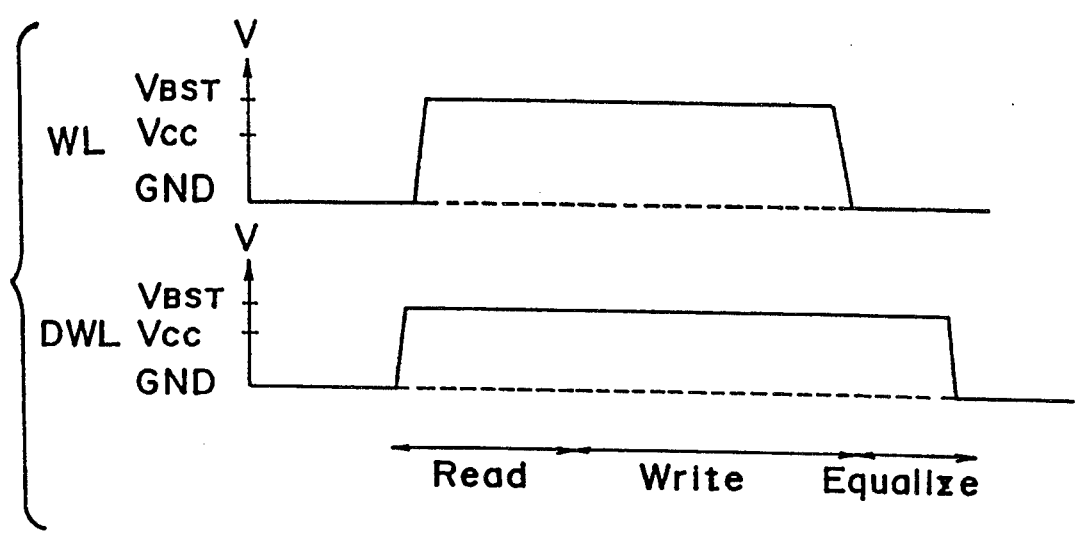
FIG. 3 is a waveform chart showing drive signal waveforms for the word line and the dummy word line in the DRAM of FIG. 2.

As obvious from the figure, the sense amplifiers 11, 13; 12, 14; 2, 4 in each row are spaced from each other the distance corresponding to at least four times the bit line pitch as in the DRAM shown in FIG. 2. Therefore, as mentioned with respect to the arrangement of FIG. 2, even if the bit line pitch becomes smaller, each sense amplifier SA (more specifically the channel length and-/or diffusion region of each transistor) can occupy an area sufficiently wide to attain a high sensitivity. Accordingly, this arrangement can be applied to high-density semiconductor memory devices having storage capacity of more than 64 Mbits.

Figure 5:
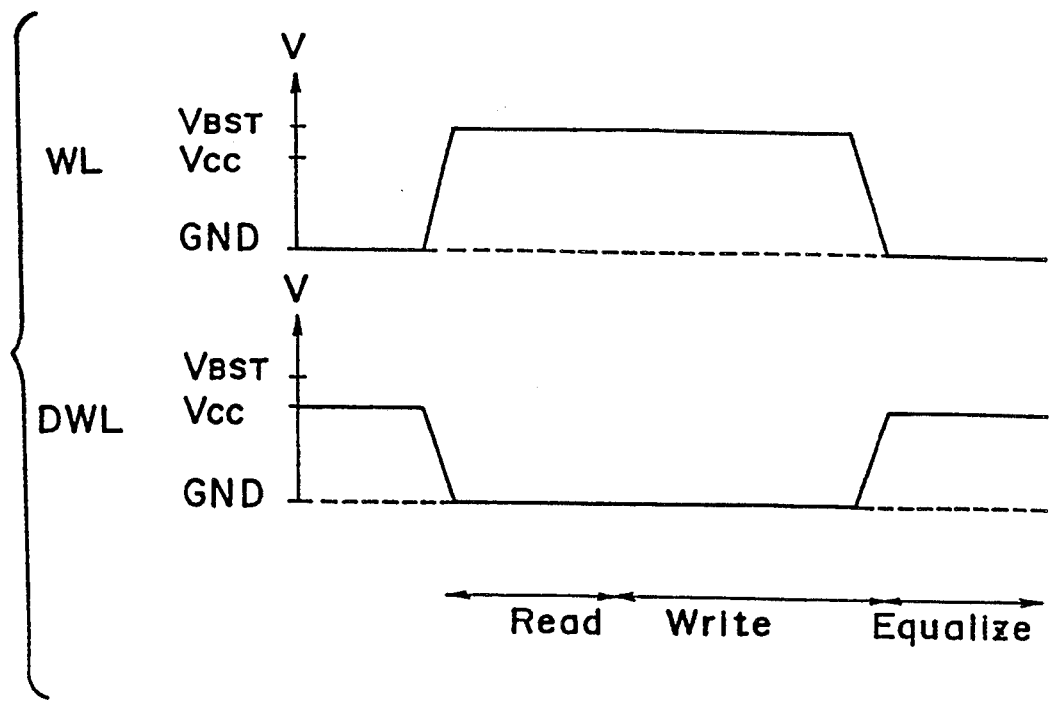
FIG. 5 is a waveform chart showing drive signal waveforms for the word line and the dummy word line of the DRAM as shown in FIG. 4.

In operation, a drive signal of an elevated potential VBST=4.5 V is applied from a control section 20 including a booster 21 (see FIG. 4) to a selected word line WL (here WL1 or WL2) as shown in FIG. 5 to activate the word line. Thereby, the memory cells MC connected to the selected word line are electrically connected to the corresponding bit lines, which are thus activated. For instance, when the WL1 located in the cell array block MB2 between the first and second rows of the sense amplifiers is selected for activation, memory cells MC connected to this word line WL1 are electrically connected with the bit lines BL0, BL2, BL4, BL6, which bit lines are thus activated. At the same time, dummy cells DC are electrically disconnected from the same bit lines BL0, BL2, BL4, BL6 since a signal opposite in phase to the signal supplied to the word line WL1 (a signal that changes from a potential of an electric power supply VCC=3.3 V to a potential of ground GND=0 V as shown in FIG. 5) is applied from the control section 20 to the dummy word line DWL1 provided in the same cell array block MB2. Note that in FIG. 5, word lines including WL1 and WL2 are represented by WL and dummy word lines DWL1 and DWL2 are represented by DWL.

With the above-mentioned operation, dummy cells DC connected to the bit lines BL0, BL2, BL4, BL6 are electrically disconnected from the bit lines BL0, BL2, BL4, BL6. As a result, the capacitances of the bit lines BL0, BL2, BL4, BL6 are kept unchanged. Furthermore, noise due to parasitic capacitances between the word line WL1 and the bit lines BL0, BL2, BL4, BL6 are canceled by the noise from the dummy word line DWL1 having a characteristic opposite to the noise from the word line WL1. Thus, the noises generated due to the activation of the word line and the bit lines can be canceled.

As described above, in the semiconductor memory device of the present embodiment, when a word line in a certain cell array block is selected to be activated, only one dummy word line in the same cell array block is required to be operated for cancellation of noises. Accordingly, the address selection for the dummy word lines becomes much easier and the operation and circuit design for driving the dummy word lines DWL are simplified much more, as compared with the DRAM shown in FIG. 2.

The dummy word driving method of the present invention may be called "reverse phase dummy word line driving method".

Figure 6:
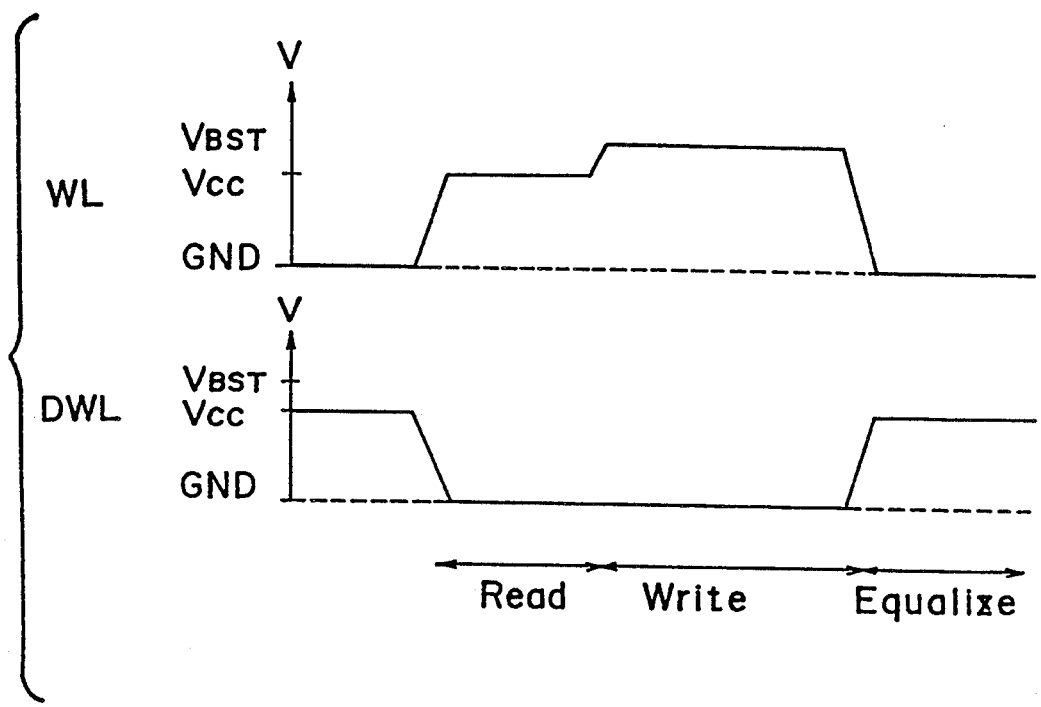
FIG. 6 is a waveform chart showing other drive signal waveforms for the word line and the dummy word line of the DRAM as shown in FIG. 4.

Normally, the elevated potential VBST=4.5 V, which is greater than the potential of a power supply VCC, is applied to the selected word line WL as described above. In this case, in order to completely cancel noise by the "reverse phase dummy word line driving method", it is preferred to keep the dummy word line DWL at the elevated potential VBST=4.5 V when the dummy word line is inoperative and drive it to the potential of ground GND=0 V when it is required to operate such that a change in potential on the selected word line is equal to that on the selected dummy word line. However, it is impractical to always put the booster 21 in operation. The power consumption also increases. Drive signals for the word line and the dummy word line as shown in FIG. 6 are a solution to this inconvenience. That is, as shown in FIG. 6, the dummy word line DWL is kept at the potential of a power supply VCC=3.3 V when not selected. When data is read out from memory cells, the potential of the word line WL is raised to the same potential VCC=3.3 V, and at the same time the potential of the dummy word line DWL is dropped to the potential GND. In this way, noises are substantially canceled. Then, to write data, the elevated potential VBST=4.5 V is applied to the word line WL such that data writing is satisfactorily carried out. With the above-mentioned operation, possible generation of noises can be suppressed in the data reading time. It is to be noted that it is sufficient to apply the potential of a power supply VCC to the word line WL in the data reading time for the reason that a signal at around a pre-charged potential (normally a half of the potential of a power supply VCC) is required to be transmitted in the data reading time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device, comprising:
   a plurality of sense amplifiers of differential type arranged in one direction in rows, wherein the neighboring rows constitute associated first and second rows and the sense amplifiers of the first and second rows are disposed alternately with each other in a staggering manner and the sense amplifiers of each row are spaced from adjacent sense amplifiers in the same row by a distance at least equal to four times of a bit line pitch;
   two pairs of alternatively-activated bit lines extending from each of the sense amplifiers of the first and second rows in opposite first and second directions, wherein the bit lines extending from the sense amplifiers of the first row in the first direction and the bit lines extending from the sense amplifiers of the second row in the second direction constitute a bit line group between the first and second rows, wherein said bit line pitch is the distance between bit lines in said pairs of bit lines in each respective bit line group;
   a plurality of word lines intersecting said bit line group;
   a pair of dummy word lines intersecting said bit line group, said pair of dummy word lines positioned in proximity to said word lines;
   a plurality of memory cells disposed at intersections between the bit lines in said bit line group and said word lines such that the memory cells connected with one word line are connected with alternate bit lines and that the memory cells connected with one bit line are connected with alternate word lines;
   a plurality of dummy cells disposed at intersections between the bit lines in said group and said dummy word lines such that the dummy cells connected with one dummy word line are connected with the alternate bit lines and that the dummy cells connected with the other dummy word line are connected with the remaining bit lines;
   a control section for controlling activation of a selected one of said word lines by a signal, said control section applying to a corresponding dummy word line a signal opposite in phase from that applied to said selected word line such that when the memory cells connected with the activated word line are electrically connected with the associated bit lines, the dummy cells connected with the same bit lines are electrically disconnected therefrom.

2. The semiconductor memory device as claimed in claim 1, wherein said control section controls a potential of each dummy word line to a first high level when the dummy word line is not selected and to a low level when the dummy word line is selected; while controlling a potential of each word line to said first high level during a time of data reading, to a second high level higher than said first high level during a time of data writing, and to said low level when the word line is not selected.

3. The semiconductor memory device as claimed in claim 2, wherein said first high level is a level of a power supply and said low level is a level of ground.

4. The semiconductor memory device as claimed in claim 3, wherein said first high level is 3.3 V and said second high level is 4.5 V.

5. The semiconductor memory device as claimed in claim 1, wherein wherein said controlling section controls a potential of each dummy word line to a first high level when the dummy word line is not selected and to a low level when the dummy word line is selected; while controlling a potential of each word line to a second high level higher than said first high level during both a time of data reading and a time of data writing, and to said low level when the word line is not selected.

6. The semiconductor memory device as claimed in claim 5, wherein said first high level is a level of a power supply and said low level is a level of ground.

7. The semiconductor memory device as claimed in claim 6, wherein said first high level is 3.3 V and said second high level is 4.5 v.

* * * * *